United States Patent
Lim

(10) Patent No.: US 6,629,052 B2
(45) Date of Patent: Sep. 30, 2003

(54) ADJUSTMENT METHOD FOR REDUCING CHANNEL SKEW OF TEST SYSTEM

(75) Inventor: Sang-gyu Lim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/879,901

(22) Filed: Jun. 14, 2001

(65) Prior Publication Data

US 2001/0053960 A1 Dec. 20, 2001

(30) Foreign Application Priority Data

Jun. 16, 2000 (KR) ........................................ 2000-33234

(51) Int. Cl.$^7$ .............................................. G01D 18/00
(52) U.S. Cl. ....................................................... 702/85
(58) Field of Search ............................ 702/85, 89, 106, 702/107, 117, 66, 67, 71; 324/601, 73.1

(56) References Cited

U.S. PATENT DOCUMENTS

| | | | | |
|---|---|---|---|---|
| 4,497,056 A | * | 1/1985 | Sugamori | ................... 714/736 |
| 5,225,775 A | * | 7/1993 | Sekino | ..................... 324/158.1 |
| 5,884,236 A | * | 3/1999 | Ito | ............................... 702/89 |
| 6,263,290 B1 | * | 7/2001 | Williams et al. | .............. 702/71 |

* cited by examiner

*Primary Examiner*—Michael Nghiem
(74) *Attorney, Agent, or Firm*—Volentine Francos, PLLC

(57) ABSTRACT

A method for reducing channel skew of a test system which has a plurality of channels and which is used for testing a device connected thereto. The method includes performing system calibration, fine adjusting the test system manually, and recording signal characteristics appearing at the channels during the fine adjusting as eye-shmoo data indicating rising or falling characteristics of signals. Thereafter, system calibration on the test system is performed when a predetermined period has elapsed since the recording, and skew between the channels is then adjusted by performing software processing of the test system using the recorded data. Since the device is not installed in the test system during the test, damage of the test system socket pads may be prevented, so that an error in the test system can be reduced. In addition, time for adjusting channel skew can be reduced.

2 Claims, 5 Drawing Sheets

ADJUSTMENT METHOD FOR REDUCING CHANNEL SKEW OF TEST SYSTEM

The present application claims priority under 35 U.S.C. §119 to Korean Application No. 2000-33234 filed on Jun. 16, 2000, which is hereby incorporated by reference in its entirety for all purposes.

BACKGROUND OF THE INVENTION

1. Field of the Invention

The present invention relates to a method of testing a test system, and more particularly, to a method for reducing channel skew of a test system.

2. Description of the Related Art

Test systems are required to operate at high frequency to test the high speed operation of semiconductor apparatuses. For example, when testing the operation of a Rambus dynamic random access memory (DRAM) sending and receiving data in packet units at 800 MHZ, a test system measures a setup time and a hold time on the basis of the crossing point of master clock signals CFM and CFMN, and uses the measured setup time and hold time as reference data. This reference data is referred to as a test bin. The possibility that the test bin has an error due to skew of a signal of a data pin DQ or an instruction code pin RQ in a Rambus DRAM is high.

Incidentally, the data pin DQ of the Rambus DRAM is used for inputting and outputting data and is bidirectional, and the instruction code pin RQ is used for receiving packet information which includes instruction codes transmitted from the Rambus DRAM controller or master. Also, master clock signals CFM and CFMN are generated from the Rambus DRAM controller or master, and are synchronized with the data transmitted from the master. Master clock signal CFMN is the same as master clock signal CFM, but merely 180° out of phase therewith.

FIG. 1 is a diagram illustrating a conventional method of adjusting a test system to reduce an error in a test bin. Referring to FIG. 1, in step 101, the test system automatically performs system calibration on the pins of a Rambus DRAM, which are inserted in sockets of the test system. Next, in step 102, the test system performs manual tweaking for fine adjustment. When it is determined in step 103 that three months has elapsed since manual tweaking in step 102, the step 101 of performing system calibration and the step 102 of performing tweaking are repeated. Due to such a periodic adjustment method, an error in a test bin can be reduced.

According to such a conventional method, scope probing should be performed on a socket pad every three months for adjustment of a test system for periodic calibration and tweaking. As a result, there occurs transformation such as enlargement of a pin hole 201 of a socket pad, as shown in FIG. 2. The transformation of a socket pad causes signal characteristics to be degraded. This will be described with reference to FIG. 3, which illustrates the distribution of data output tQ of a Rambus DRAM.

In FIG. 3, "tQ_min" denotes a time period from the crossing point of the master clock signals synchronized with a read command, to a point at which data is read. The distribution of time periods tQ_min with respect to the number of tests is shown in FIG. 3. A distribution (a graph represented by -●-) of time periods tQ_min measured with a transformed socket pad has a larger variation than a distribution (a graph represented by -○-) of time periods tQ_min measured with a normal socket pad without transformation. This means that channel skew occurs depending on a state of a socket pad so that a test error may increase.

Accordingly, an adjustment method of a test system for reducing a test error and for maintaining the normal state of a socket pad is desired.

SUMMARY OF THE INVENTION

The present invention is therefore directed to a method of testing a test system which substantially overcomes one or more of the problems due to the limitations and disadvantages of the related art.

To solve the above problems, it is an object of the present invention to provide an adjustment method of a test system for reducing a test error and for maintaining the normal state of a socket pad.

Accordingly, to achieve the above object of the invention, there is provided a method of adjusting a test system which has a plurality of channels and is used for testing a device connected thereto. The method includes the steps of (a) performing system calibration on the test system, (b) scope probing a test pin of the test system and fine adjusting the test system manually, (c) recording signal characteristics appearing at the channels during step (b) using the test system, (d) performing system calibration on the test system when a predetermined period has elapsed since step (c), and (e) adjusting skew between the channels using data which has been recorded in step (c).

For example, the data recorded in step (c) may be eye-shmoo data indicating the rising or falling characteristics of the signals, and step (e) may include software processing of the test system. Because the device is not installed to the test system in this testing method of the test system, transformation or deterioration of pad sockets may be reduced as compared to the conventional method of adjusting a test system. According to the present invention, damage to a socket pad of the test system is prevented, so that an error in the test system can be reduced. In addition, time for adjusting channel skew can be reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PRESENT INVENTION

Figure 1:
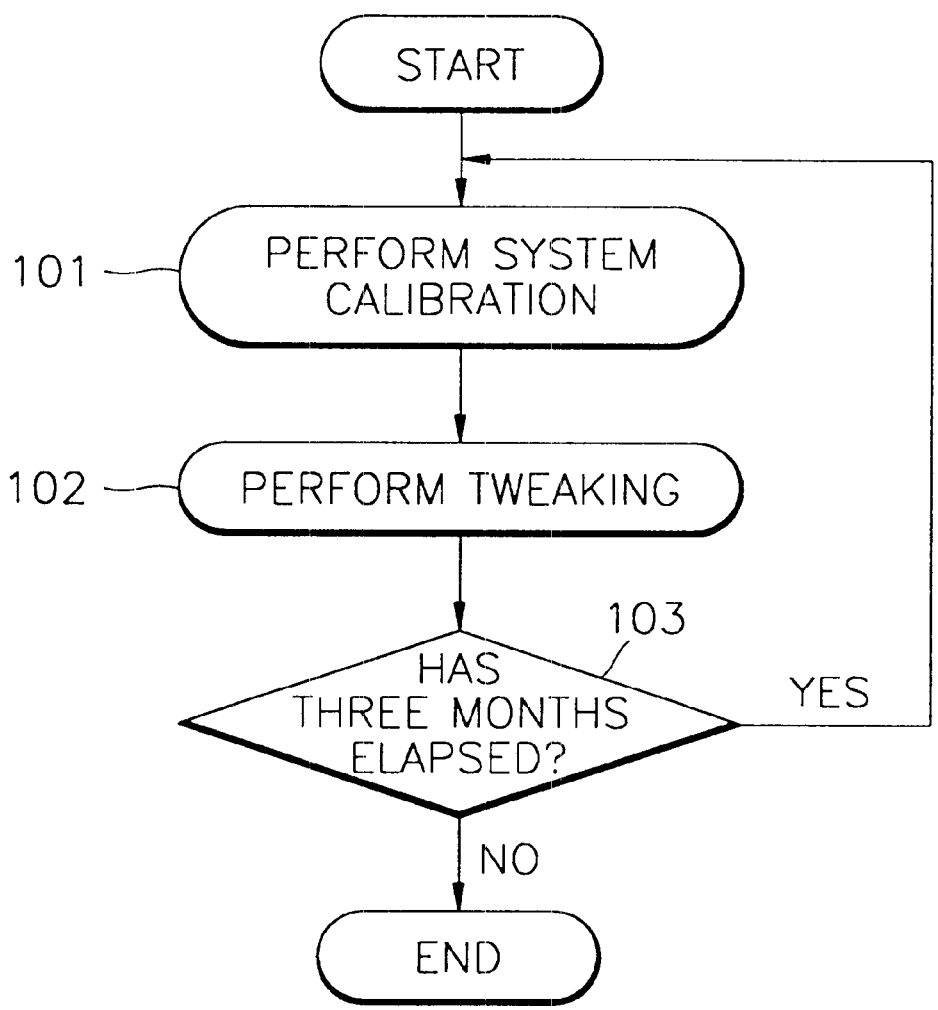
FIG. 1 is a flowchart illustrating a conventional method of adjusting a test system.
Figure 2:
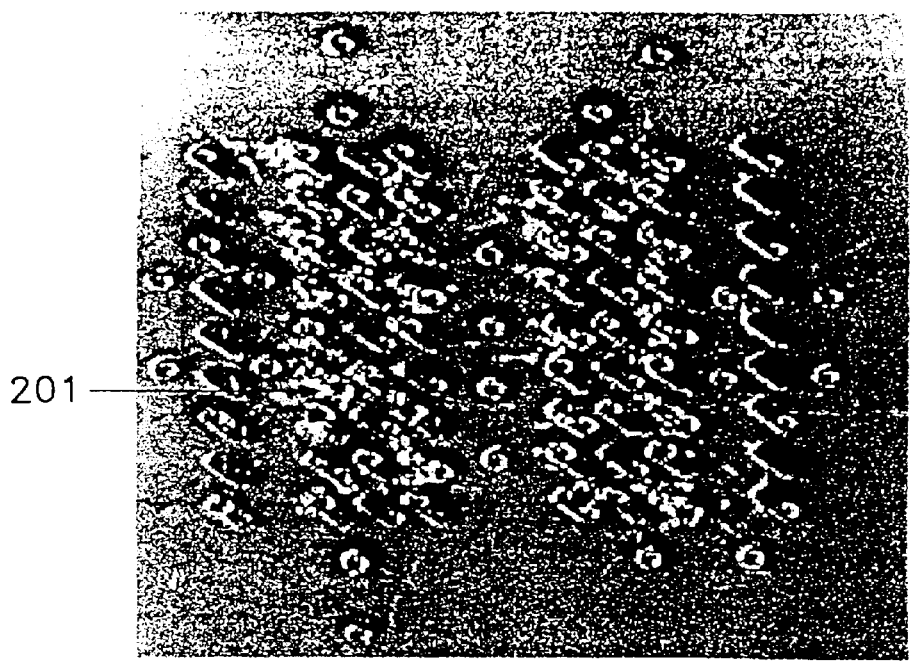
FIG. 2 is a diagram illustrating a state of a socket pad of a test system using the method of FIG. 1.
Figure 3:
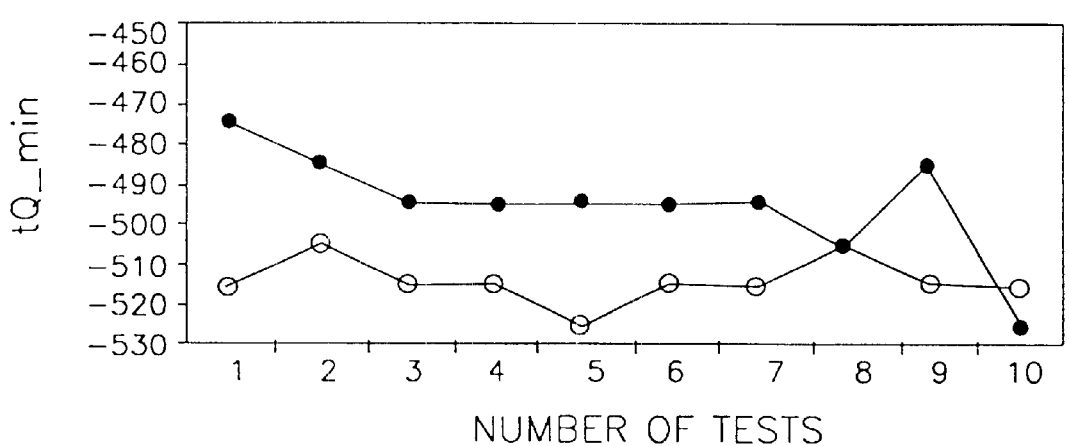
FIG. 3 is a diagram illustrating an error distribution of data output with respect to the number of tests.

Hereinafter, the present invention will be described in detail by explaining a preferred embodiment of the present invention with reference to the attached drawings.

Like reference numerals in the drawings denote the same members.

Figure 4:
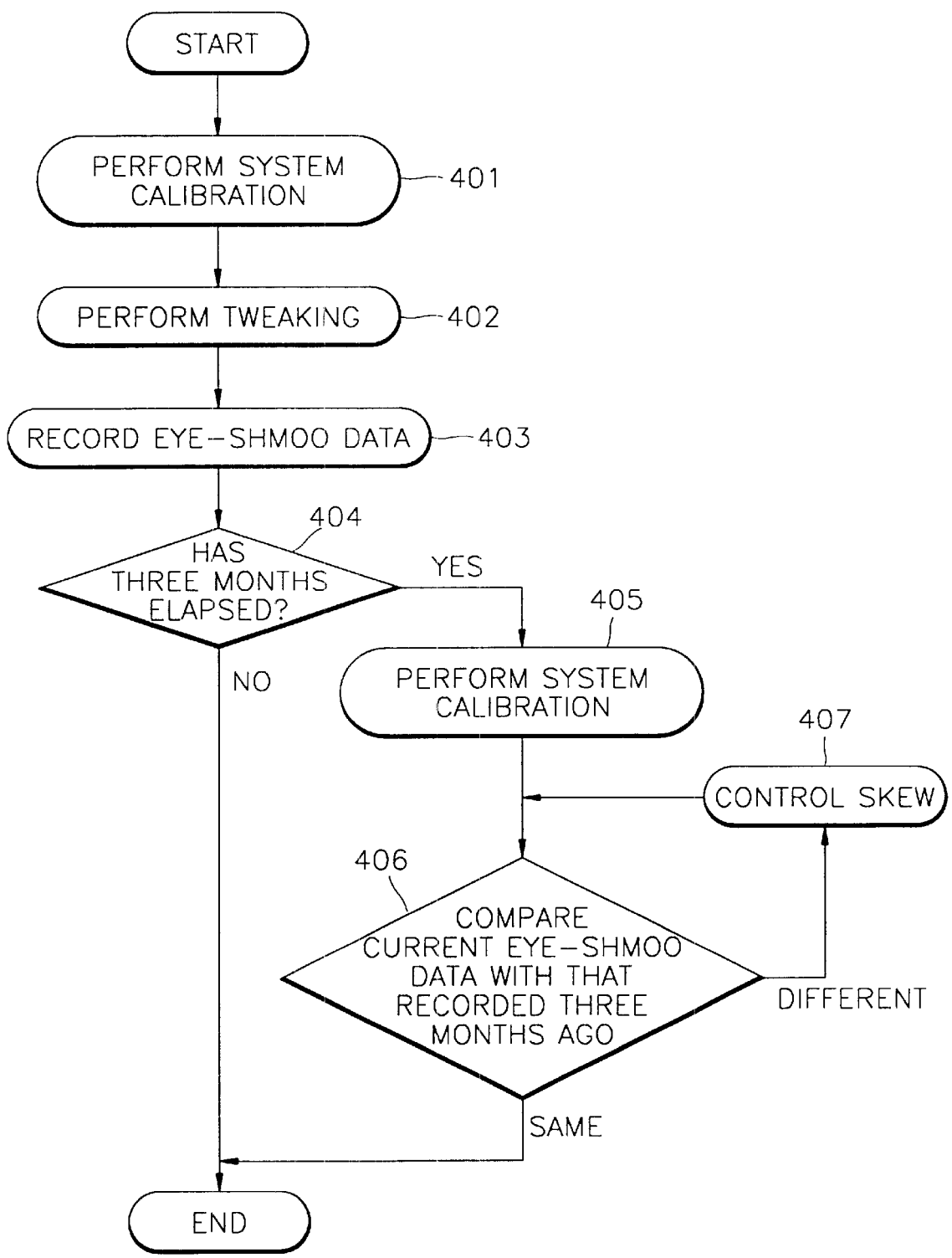
FIG. 4 is a flowchart illustrating a method of adjusting a test system according to an embodiment of the present invention.

Referring to FIG. 4, in step 401, a test system performs first system calibration thereon. In step 402, the test system performs manual tweaking for fine adjustment. In step 403, the test system records the rising or falling characteristic of a signal of a system channel. Such recorded data is referred to as eye-shmoo data. For example, the eye-shmoo data has as reference data master clock signals CFM and CFMN, as shown in FIG. 5, or a data pin DQ or an instruction code pin RQ, as shown in FIG. 6.

Figure 5:
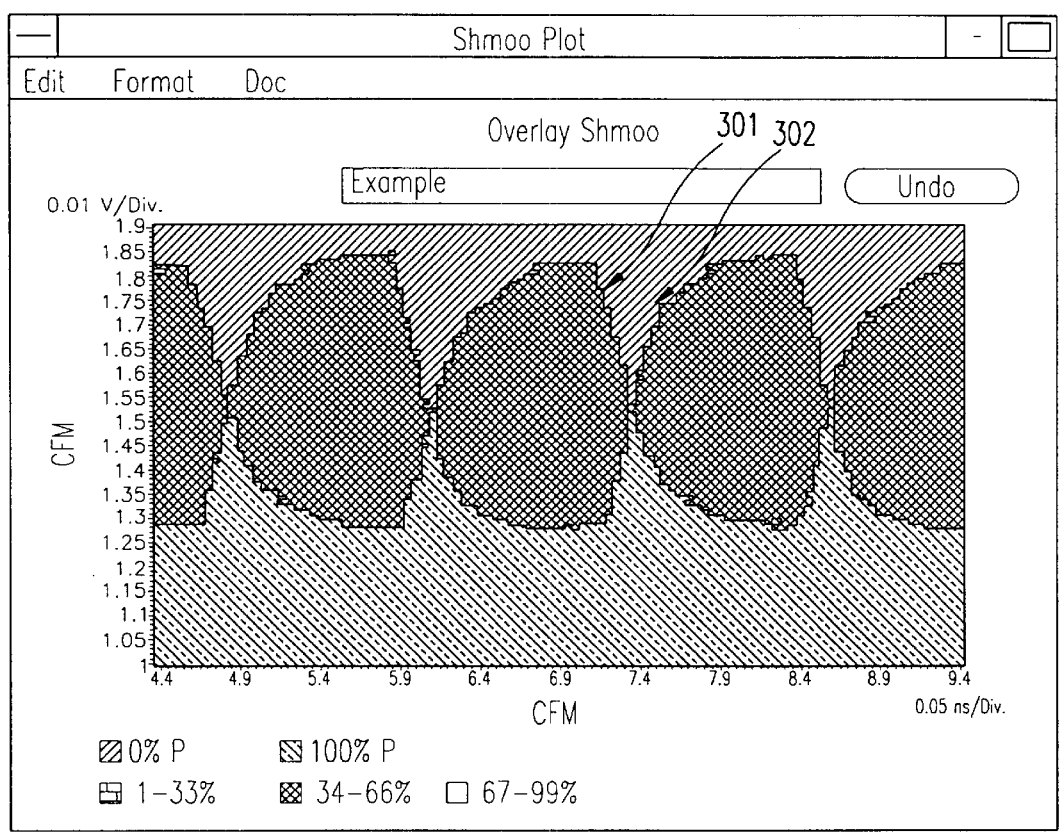
FIG. 5 is a diagram illustrating eye-shmoo data with respect to a master clock signal.
Figure 6:
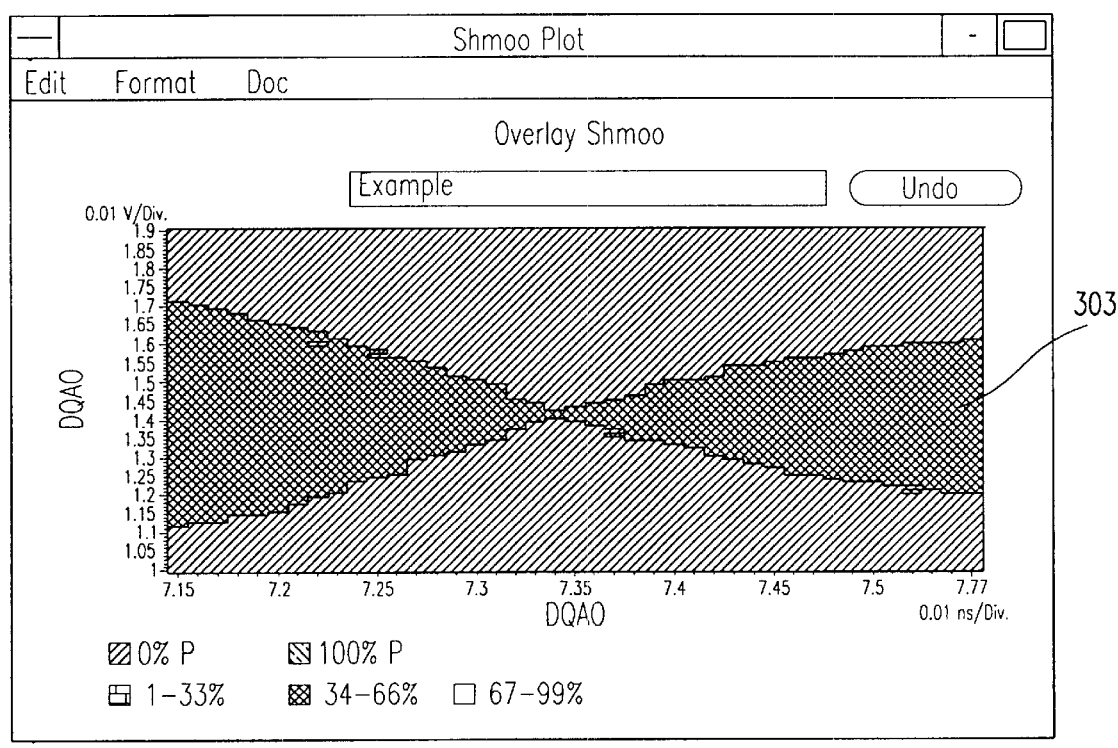
FIG. 6 is a diagram illustrating eye-shmoo data with respect to a data pin.

In FIG. 5, 301 denotes the falling edge of the CFM and 302 the rising edge of the CFM. The shaded region is an overlapping screen area where the test results of the CFM are plotted several times. In FIG. 6, 303 denotes an area that is the same as the region between 301 and 302 of FIG. 5. The percentages in FIGS. 5 and 6 are indicative of probabilities of acquiring the same test results.

For the tweaking, an accuracy is required so that the test system has an error less than 10 ps for each channel, because channel jitters may occur due to an error of about 10 ps. When the sum of an error in a master clock signal and an error in a data pin DQ or an instruction code pin RQ is 20 ps or larger, and an error in the tweaking itself is 10 ps or larger, an error in the entire test system increases. Accordingly, the reliability on the test results of the test system is decreased.

Referring back to FIG. 4, in step 404, it is determined whether a predetermined period, for example, three months, has elapsed since the first system calibration and the tweaking were performed in the steps 401 and 402. When it is determined in step 404 that the predetermined period has elapsed, second system calibration is performed on the test system itself in step 405. Thereafter, in step 406, current eye-shmoo data is compared with that recorded three months ago in the step 403. In step 407, skew between channels is adjusted.

It is to be understood that steps 401 and 402 can be carried out without a Rambus DRAM inserted into the pad sockets of the test system. An important feature of this invention is that steps 401, 402, and 403 are carried out without a Rambus DRAM to calibrate the test system, and three months later step 406 is carried out without a Rambus DRAM to calibrate the test system, by comparing the recorded eye-shmoo data of step 403 and the current eye-shmoo data. It is to be further understood that the method of calibration and tweaking of the test system is performed by a scope probing in order to control parameters of a test pin, for example, delay time and capacitance of the test pin.

It is to be further understood that in step 407, unlike a conventional method, skew is adjusted by the test system using software, without inserting a device such as a Rambus dynamic random access memory (DRAM) in the socket pad of the test system. Accordingly, damage of the socket pad is prevented, so that an error in the test system can be reduced. In addition, when tweaking is performed every three months according to a conventional method, it takes much time to adjust a test system having a large number of channels because the tweaking is performed manually. The present invention replaces manual tweaking with software processing, so that time for adjusting skew can be reduced. Software tweaking in this instance involves recording manual probing test results of sockets.

Also, as would be understood by one of ordinary skill, the test environment consists of a DTL (Dual Transmission Line) structure. The DTL structure has two channels, an input driver channel and an output comparator channel, connected to each other on the test socket board. A signal input from the input driver channel is output through the output comparator channel. This signal output through the output comparator channel is eye-shmoo data.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of adjusting a test system which has a plurality of channels and is used for testing a device connected thereto, the method comprising:

performing system calibration on the test system;

scope probing a test pin of the test system and fine adjusting the test system manually;

recording signal characteristics appearing at the channels during said fine adjusting;

performing system calibration on the test system when a predetermined period as elapsed since said recording; and adjusting skew between the channels using the recorded signal characteristics, wherein said step of adjusting skew comprises:

obtaining current signal characteristics of the test system;

comparing the recorded signal characteristics with the current signal characteristics; and adjusting the skew based on the comparison, and wherein the recorded signal characteristics and the current signal characteristics are obtained without a device installed to the test system.

2. A method of adjusting a test system which has a plurality of channels and is used for testing a device connected thereto, the method comprising:

performing system calibration on the test system; to the test system;

scope probing a test pin of the test system and fine adjusting the test system manually;

recording signal characteristics appearing at the channels during said fine adjusting;

performing system calibration on the test system when a predetermined period has elapsed since said recording; and adjusting skew between the channels using the recorded signal characteristics, wherein recording signal characteristics is performed without a device installed to the test system.

* * * * *